United States Patent [19]

Sakaida et al.

[11] Patent Number: 5,004,946

[45] Date of Patent: Apr. 2, 1991

[54] PARALLEL FOUR-LINK MECHANISM

[75] Inventors: Atsuo Sakaida, Gifu; Yoshiyuki Ikezaki, Nagoya; Akira Iriguchi, Nagoya; Toshio Inose, Nagoya, all of Japan

[73] Assignee: Brother Kogyo Kabushiki Kaisha, Nagoya, Japan

[21] Appl. No.: 548,097

[22] Filed: Jul. 5, 1990

[30] Foreign Application Priority Data

Jul. 6, 1989 [JP] Japan .................................. 1-175162

[51] Int. Cl.[5] .............................................. H01L 41/08

[52] U.S. Cl. ...................................................... 310/328

[58] Field of Search .......................................... 310/328

[56] References Cited

U.S. PATENT DOCUMENTS 4,435,666 3/1984 Fukui et al. ........................ 310/328
4,518,887 5/1985 Yano et al. .......................... 310/328
4,570,095 2/1986 Uchikawa ........................... 310/328
4,633,118 12/1986 Kosugi ............................... 310/328
4,686,440 8/1987 Hatamora et al. .................. 310/328
4,783,610 11/1988 Asano ................................ 310/328
4,874,978 10/1989 Sakaida et al. ...................... 310/328
4,937,489 6/1990 Hattori et al. ...................... 310/328

FOREIGN PATENT DOCUMENTS 0213484 12/1983 Japan .................................. 310/328
0175387 10/1984 Japan .................................. 310/328
0018980 1/1985 Japan .................................. 310/328

OTHER PUBLICATIONS

U.S. Ser. No. 375,403 filed on Jul. 3, 1989 (copy of filing receipt attached).

*Primary Examiner*—Mark O. Budd
*Assistant Examiner*—Thomas M. Dougherty
*Attorney, Agent, or Firm*—Kane, Dalsimer, Sullivan, Kurucz, Levy, Eisele and Richard

[57] ABSTRACT

In a motion conversion mechanism for converting mechanical expansion and compression of a material, such as a piezo electric element, to the motion of the other material, provided are moving member arranged to be movable in accordance with the motion of the material along a predetermined direction, transmitting member for transmitting the movement of the moving member toward the other material along the predetermined direction, and regulating member for regulating the transmitting operation of the transmitting member so as not to be skewed from the predetermined direction. Thus, the transmitting operation of is accurately executed.

8 Claims, 11 Drawing Sheets

PARALLEL FOUR-LINK MECHANISM

BACKGROUND OF THE INVENTION

The present invention relates to an integrally formed parallel four-link mechanism made of a plate-like material, more particularly to a parallel four-link mechanism arranged in such a manner that the mechanical fatigue of hinge sections exposed to stress on their opposed inner surface is decreased.

This type of parallel four-link mechanism, proposed by the same assignee in, for example, Japanese Patent Application SHO No. 63-182063 (corresponding U.S. application: U.S. Ser. No. 375403), has been used in a motion conversion mechanism which employs a piezo electric element.

By referring to FIGS. 1 and 2, an outline of the above motion conversion mechanism will be described hereinafter. The motion conversion mechanism is provided with a base section 3 for supporting one end of a piezo electric element 1 in the compression and expansion directions. A pair of leaf springs 6 and 7 being secured to a main frame 2 extended along the longitudinal direction of the piezo electric element 1 and to a moving member 5 disposed on the other end of the compression and expansion direction of the piezo electric element 1, respectively. An inclining member 8 which links both the leaf springs 6 and 7 is inclined by the deformations of both the leaf springs 6 and 7 according to the expansion and compression of the piezo electric element 1.

In the motion conversion mechanism described above, a parallel four-link mechanism 16 is disposed midway between a sub frame 4 and the moving member 5 which are also placed on the base section 3 of the main frame 2.

The parallel four-link mechanism 16 is elastically deformed according to the expansion and compression of the piezo electric element 1 so as to displace the moving member 5 in parallel with the expansion and compression direction of the piezo electric element 1 and prevent abnormal deformations of the leaf springs 6 and 7 due to the inclination of the moving member 5.

The parallel four-link mechanism 16 is formed with a sheet of leaf spring material elastically deformed by a punching process and a bending process as shown in FIGS. 3 through 5. The parallel four-link mechanism 16 is mainly composed of a pair of link plate sections 17 and a connecting section 26 linked thereto. Each of link plate sections 17 is provided with a first link 18 and a second link 19 which are disposed in parallel to the vertical direction each other, a pair of third link 20 and fourth link 21 which are disposed in parallel to the horizontal direction each other and which are passed between the first link 18 and the second link 19, and hinge sections 22 through 25 which are disposed at connecting sections between the former links 18 and 19 and between the latter links 20 and 21, the width "b2" of hinge sections 22 through 25 is smaller than the width "b1" perpendicular to the lengthwise direction of the links 20 and 21 and the length thereof being "1". In addition, at a lower portion of the first link 18 of the link plate section 17, a connecting plate section 30 is provided. The first link 18 is secured to the sub frame 4. The second link 19 is secured to the moving member 5. The base section of the connecting plate section 30 is secured to the sub frame 4. One end of the connecting plate section 30 is secured to the main frame 2.

Thus, the four hinge sections 22 through 25 on the parallel four-link mechanism 16 in the prior art are formed in the same shape with each other.

When the moving member 5 is deformed according to the expansion of the piezo electric element 1, the hinge section 22 which links the first link 18 and the third link 20 and the hinge section 25 which links the second link 19 and the fourth link 21 are exposed to stress on their opposed inner surfaces. On the other hand, the hinge section 23 which links the second link 19 and the third link 20 and the hinge section 25 which links the first link 18 and the fourth link 21 are exposed to stress on their opposed outer surfaces.

In the parallel link mechanism for the motion conversion mechanism of the prior art described above, when the piezo electric element 1 expands and the moving member 5 is deformed, the amount of stress exposed to each of the hinge sections 22 through 25 become same with each other. However, since the pair of hinge sections 22 and 25 diagonally disposed at round boundaries are exposed to stress on their opposed inner surfaces, the gradation of shape on the outer surfaces of the hinge sections becomes larger than that of the straight sections on the outer surfaces thereof, resulting in a fatigue problem.

As a result of analysis using finite element method, a stress distribution in the conventional parallel four-link mechanism has been obtained as shown in FIG. 6. In the drawing, the stress becomes strong as the numeral increases. The equi-stress curve 5 represents the largest stress and equi-stress curve 4 follows. Thus, it is obvious that a large stress works at the pair of hinge sections 22 and 25 disposed in the diagonal direction and exposed to stress on the opposed inner surfaces.

In addition, since the size of the inner surface of each hinge section is very small, it is difficult to completely remove bur.

Thus, on the opposed inner surfaces of the hinge sections 22 and 25, a crack and thereby a link breakage tends to occur.

SUMMARY OF THE INVENTION

It is therefore an object of the invention to provide an improved parallel four-link mechanism which prevents a crack and resultant link breakage on the opposed inner surfaces of the hinge sections due to stress.

For this purpose, according to the invention, there is provided a parallel four-link mechanism integrally formed by a predetermined elastic material, adapted to be positioned in a motion conversion mechanism for converting mechanical expansion and compression of a predetermined material in a predetermined direction to a motion in the desired direction, for regulating the mechanical expansion and compression so as not to be skewed from said predetermined direction by means of the elastic deformation thereof in accordance with the mechanical expansion and compression, comprising a pair of plate portions oppositely located which respectively include one pair of links arranged in parallel with each other, another pair of links arranged in parallel with each other, and hinge sections provided between said links adjacently located for respectively connecting said links, said parallel four-link mechanism is arranged in such a manner that the stress generated on the opposed inner surfaces of one pair of hinge sections which are diagonally disposed becomes smaller than that generated on the outer surfaces of another pair of hinge sections which are diagonally disposed when said parallel four-link mechanism is deformed in accordance with the mechanical expansion and compression of said predetermined material.

With the above described arrangement, as the relative motion of the first and second links occurs, the stress applied to the opposed inner surfaces of the pair of hinge sections diagonally disposed is smaller than that applied to the other pair of hinge sections.

DESCRIPTION OF THE ACCOMPANYING DRAWINGS

DESCRIPTION OF THE EMBODIMENTS

Figure 7:
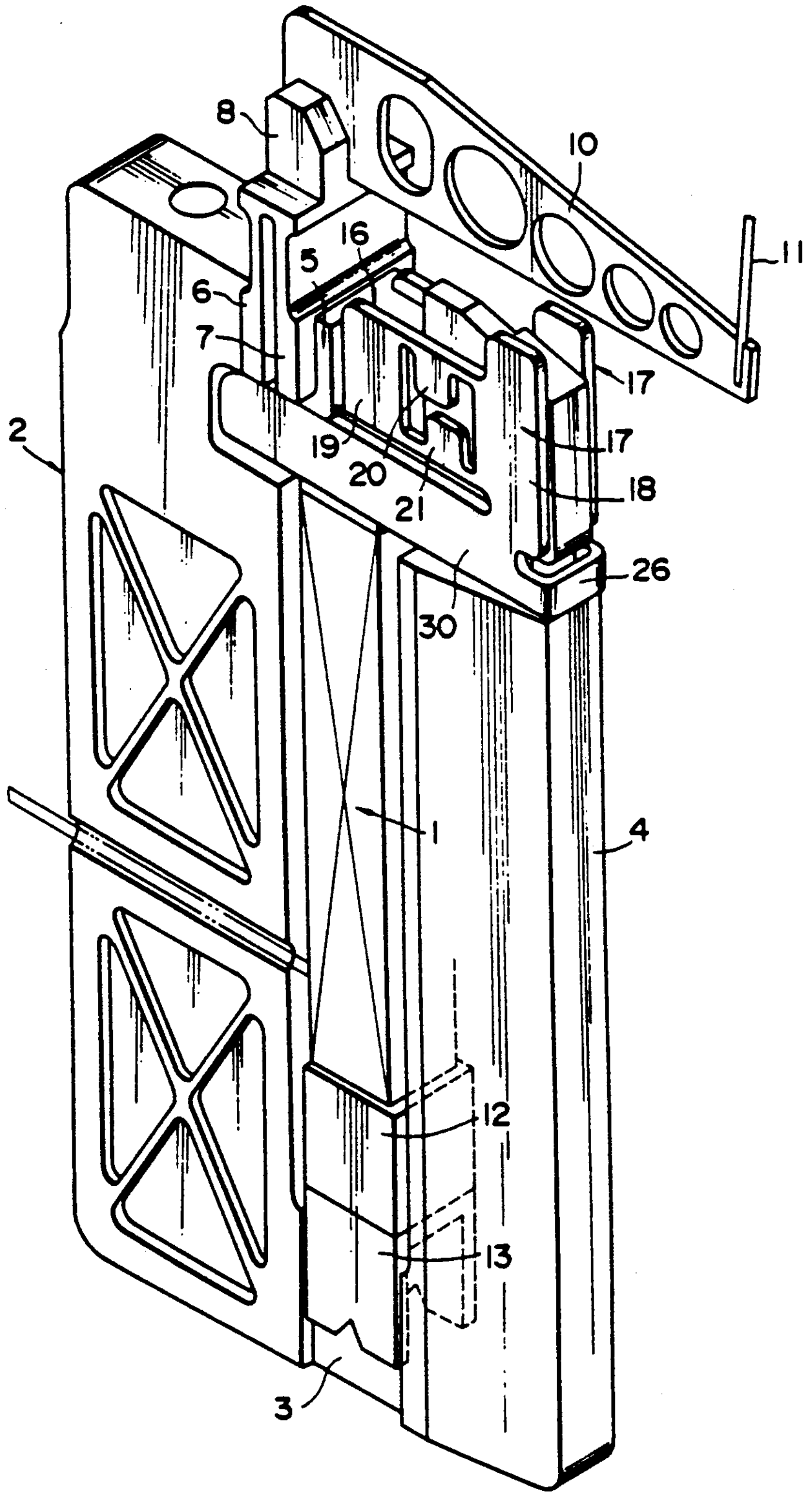
FIG. 7 is a perspective view of the motion conversion mechanism using a parallel four-link mechanism according to the present invention.
Figure 8:
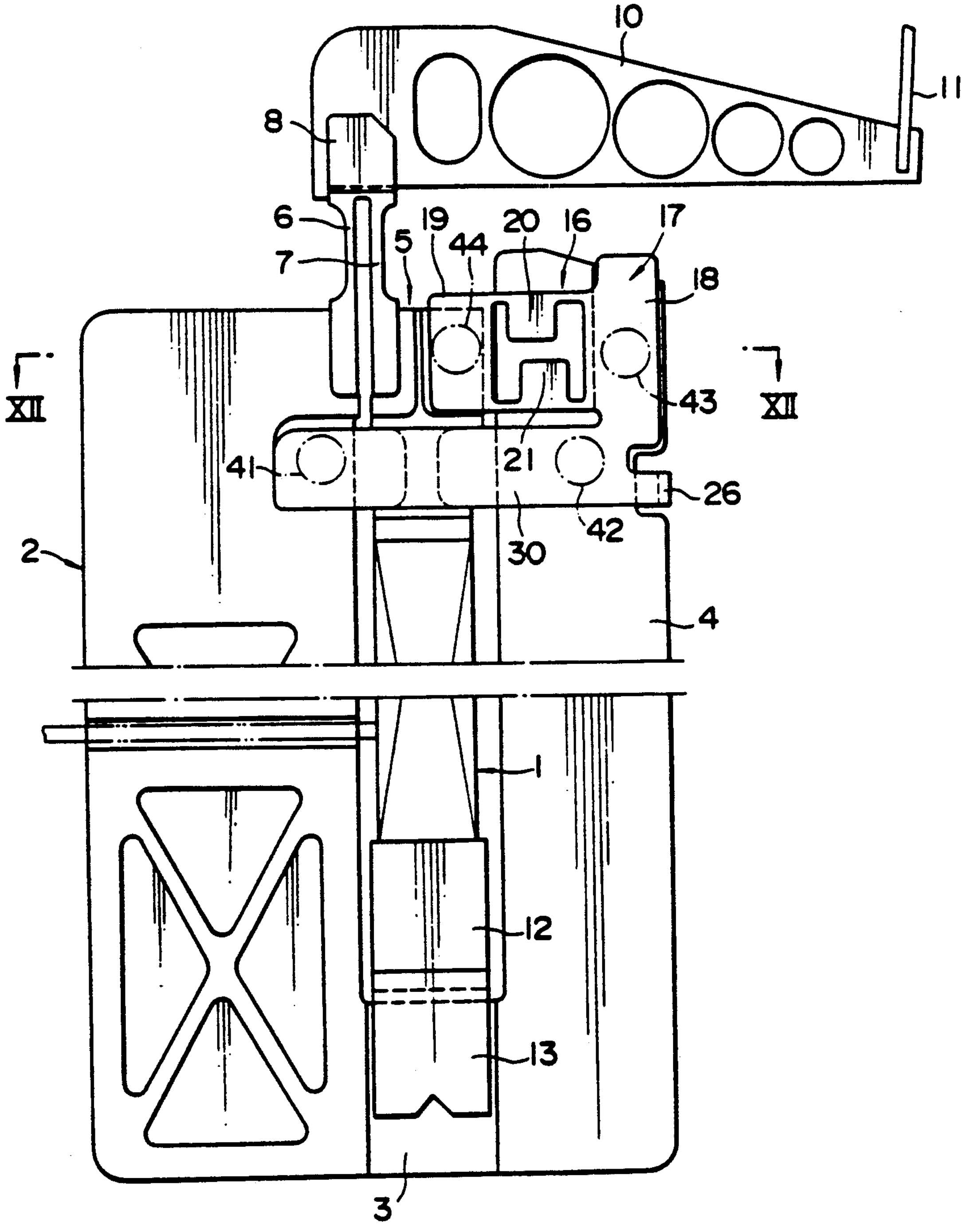
FIG. 8 is an enlarged front view of the principal section of the motion conversion of FIG. 7.

Referring to the attached drawings, an embodiment of the present invention will be described hereinafter. The parallel four-link mechanism of this embodiment is used as a component of a motion conversion mechanism for converting an expansion and compression operation of a piezo electric element into the desired direction as shown in FIG. 7 as a perspective view and in FIG. 8 as a top view thereof.

For the convenience of description, first, the motion conversion mechanism will be described. The portions or equivalent portions which are same as those in the conventional mechanism described above use the same reference numbers.

On the base section 3 downwardly extruded to the main frame 2, one end section of the piezo electric element 1 is supported via a pre-loading member 13 and a temperature compensating member 12.

At the upper end section of the piezo electric element 1, the moving member 5 is disposed.

On the opposed surfaces of the main frame 2 and the moving member 5, the pair of leaf springs 6 and 7 are provided.

The upper end section of both the leaf springs 6 and 7 are integrally linked by the inclining member 8. At the end of the inclining member 8, an inclining arm 10 having a printing wire 11 is provided.

In the motion conversion apparatus, when a predetermined voltage is applied to the piezo electric element 1 and the piezo electric element 1 expands for a particular length, the leaf spring 7 is upwardly moved due to a deforming force by the moving member 5. Thus, both the leaf springs 6 and 7 are deformed in an arc shape and the inclining member 8 is inclined. Conversely, when the voltage applied to the piezo electric element 1 stops, the piezo electric element 1 is restored to the former shape. Thus, the leaf springs 6 and 7 are elastically restored to the former shapes and the inclining member 8 is also restored to the former position.

At the base section of the main frame 2, the sub frame 4 is disposed in parallel with the main frame 2. The parallel four-link mechanism 16 is placed midway between the sub frame 4 and the moving member 5.

Figure 9:
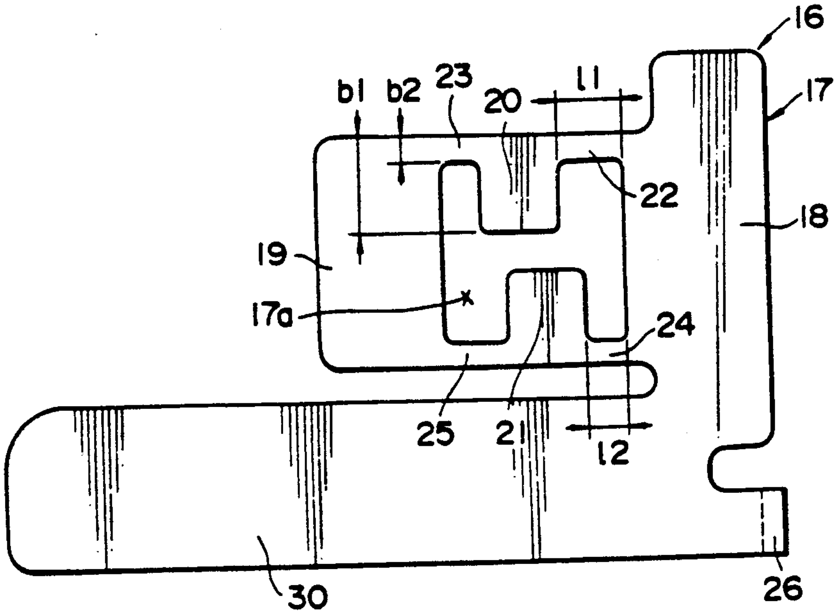
FIG. 9 is a top view of a parallel four-link mechanism according to the present invention.
Figure 10:
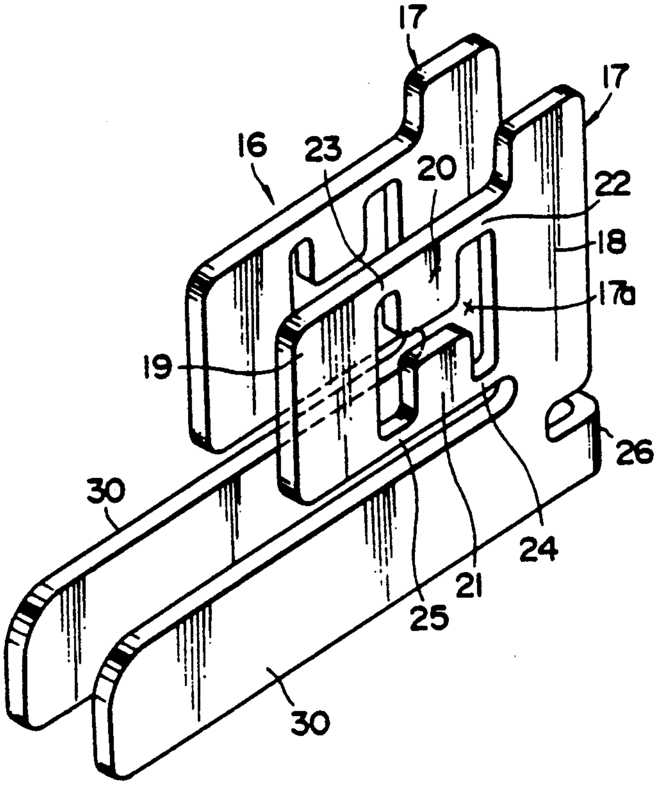
FIG. 10 is a perspective view of the parallel four-link mechanism of FIG. 9.
Figure 11:
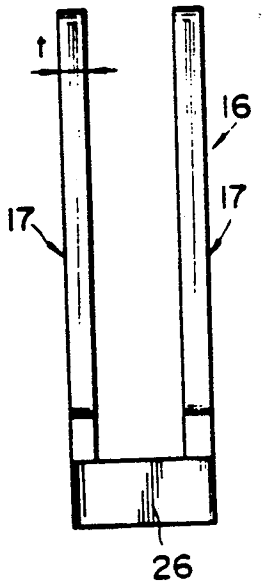
FIG. 11 is a side view of the parallel four-link mechanism of FIG. 9.

Then, by referring to FIG. 9 showing a top view of the parallel four-link mechanism 16, FIG. 10 showing a perspective view thereof, and FIG. 11 showing a side view thereof, the parallel four-link mechanism 16 according to the present invention will be described hereinafter.

The parallel four-link mechanism 16 is formed with a sheet of leaf spring material elastically deformed by a pressing process and a bending process. The parallel four-link mechanism 16 is mainly composed of the pair of plate sections 17 and the connecting section 26 which links both the plate sections 17.

Each of the link plate sections 17 is formed by cutting an "H"-shaped opening 17*a* and provided with a first link 18 and a second link 19 which are parallelly disposed in the vertical direction each other, a pair of third link 20 and fourth link 21 which are parallelly disposed in the horizontal direction each other and which are passed between the first link 18 and the second link 19, and four hinge sections disposed at connecting sections of the former links 18 and 19 and the latter links 20 and 21 such as the conventional parallel four-link mechanism. The size of the width "b2" of the hinge sections 22 through 25 is smaller than the width "b1" perpendicular to the lengthwise direction of the third link 20 and the fourth link 21. At the lower portion of the first link 18 of the link plate section 17, the connecting plate section 30 is disposed. The base section of the connecting plate section 30 is mutually disposed on the connecting section 26 so that both the plate sections 17 are linked.

The parallel four-link mechanism 16 is disposed so that the sub frame 4 and the moving member 5 are inserted into the space between the link plate sections 17. The first link 18 of the link plate section 17 is securely spot-welded to the sub frame 4 as indicated by numeral 43 in FIG. 8, while the second link 19 is securely spot-welded to the moving member 5 as indicated by numeral 44 in FIG. 8. The base section of the connecting plate section 30 is securely spot-welded to the sub frame 4 as indicated by numeral 42 in FIG. 8, while the end section of the connecting plate section 30 is securely spot-welded to the main frame 2 as indicated by numeral 41 in FIG. 8.

Figure 12:
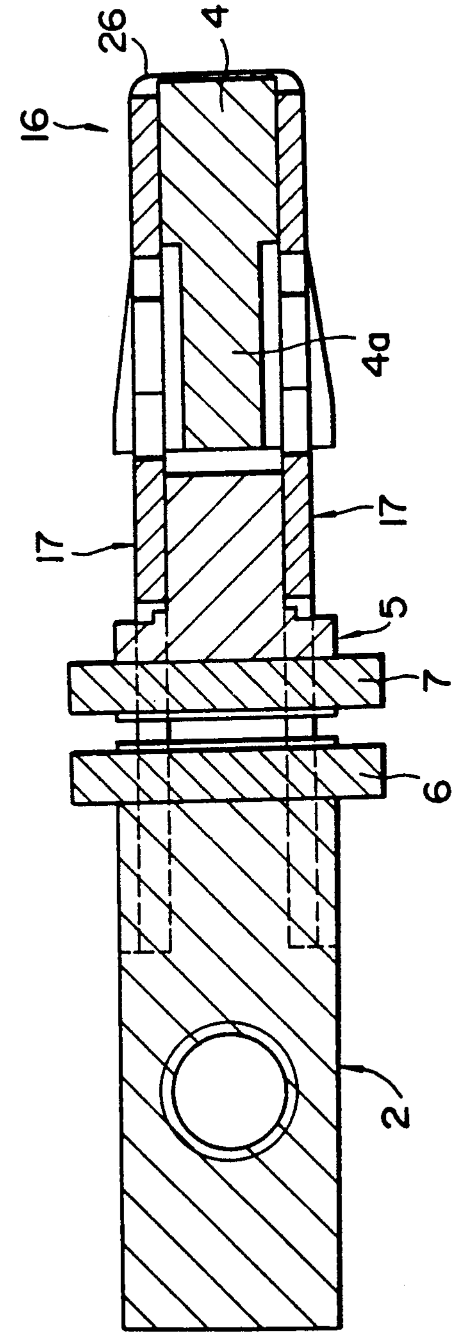
FIG. 12 is a sectional view taken along a line VI—VI in FIG. 8.

The spot-welding operation is conducted in the order of numerals 41, 42, 43, and 44 in the drawing. In the sectional view taken along line "XII—XII" of FIG. 8 as shown in FIG. 12, the portions where the third link 20, the fourth link 21, and the hinge sections 22 to 25 on the one side of the link plate section 17 face those on the other side of the link plate section 17 are thinly structured so as to prevent them from mutually interfering with each other. Thus, the frictional resistance between the link plate section 17 and the sub frame 4 due to the elastic deformation of the parallel four-link mechanism 16 caused by the expansion and compression of the piezo electric element 1 is reduced.

Since the parallel four-link mechanism 16 is elastically deformed as the piezo electric element 1 expands and compresses, the moving member 5 is displaced in parallel with the expansion and compression direction of the piezo electric element 1 so as to prevent the leaf springs 6 and 7 from being abnormally deformed due to an inclination of the moving member 5.

In this embodiment, two pairs of hinge sections, i.e., 22 and 25, 23 and 24, are arranged in such a manner that the pair of hinge sections 22, 25 is more easily deformed than the other pair of hinge sections 23, 24 is deformed. In other words, the stress generated between the hinge sections 22, 25 becomes smaller than that generated between the hinge sections 23, 24.

Figure 14:
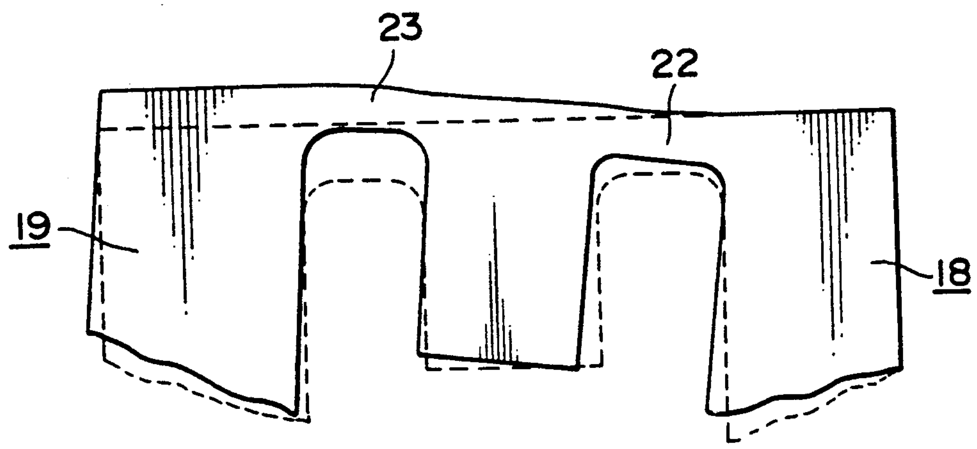
FIG. 14 is an explanatory view of the deformation applied to the parallel four-link mechanism.
Figure 16:
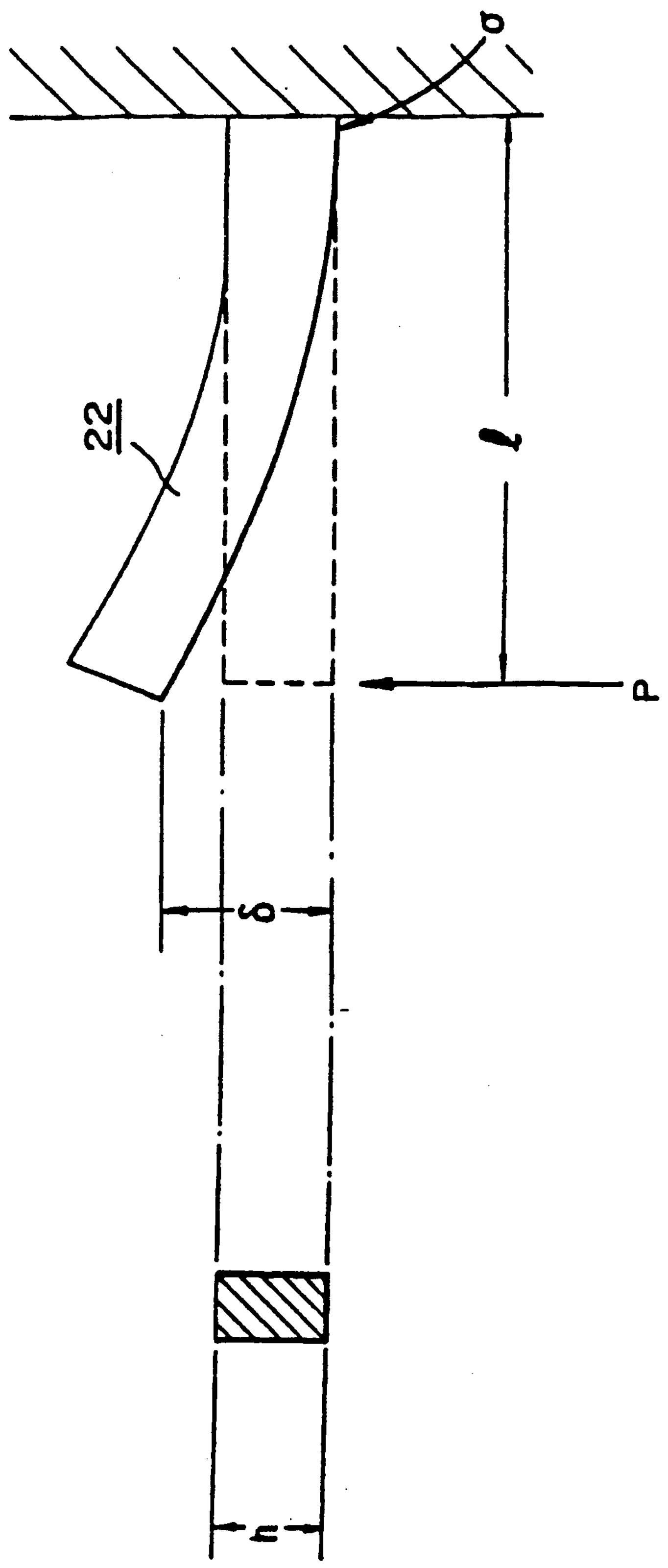
FIG. 16 is an explanatory view showing a relationship between the material to be deformed and the stress generated thereon.

Referring to the drawings of FIGS. 14 and 16, the relationship between each of the elements of the hinge sections and the stress which is generated with the deformation. FIG. 14 shows how the parallel four-link mechanism is deformed when the piezo electric element is expanded, and FIG. 16 shows an enlarged and simplified drawing of the part relating to the hinge section 22 thereof. As illustrated in FIG. 16, it can be assumed that one edge of the hinge section 22 is fixed so as not to be moved in accordance with the load "P". In FIG. 14, one edge of the hinge section 22 is fixed to the link 18. On this condition the stress generated at the fixing point of the hinge section 22 "σ" is defined by the following equation.

$$\sigma = A\frac{Eh\delta}{1}\left(\frac{1}{1}-\frac{1}{2}\right) \quad (1)$$

where,

E: Young's modulus of a material composing the hinge section;

1: length of hinge section;

h: height of the hinge section;

δ: amount of deformation;

A: predetermined constant.

Accordingly, the stress σ1 generated between the pair of hinge sections 22, 25 and σ2 generated between the other pair of hinge sections 23, 24 are respectively defined by the following equations, $$\sigma 1 = A\frac{Eh\delta}{11}\left(\frac{1}{11}-\frac{1}{2}\right)$$

$$\sigma 2 = A\frac{Eh\delta}{12}\left(\frac{1}{12}-\frac{1}{2}\right)$$

Therefore, the relationship $\sigma 1 < \sigma 2$ is satisfied on condition that $11 > 12$ as shown in FIG. 9.

Thus, by using the parallel four-link mechanism 16 described above, the tension force applied to the opposed inner surfaces of the hinge sections 22 and 25 is smaller than that applied to the opposed outer surfaces of the hinge sections 23 and 24 and thereby the fatigue of the hinge sections 22 and 25 is reduced.

Figure 6:
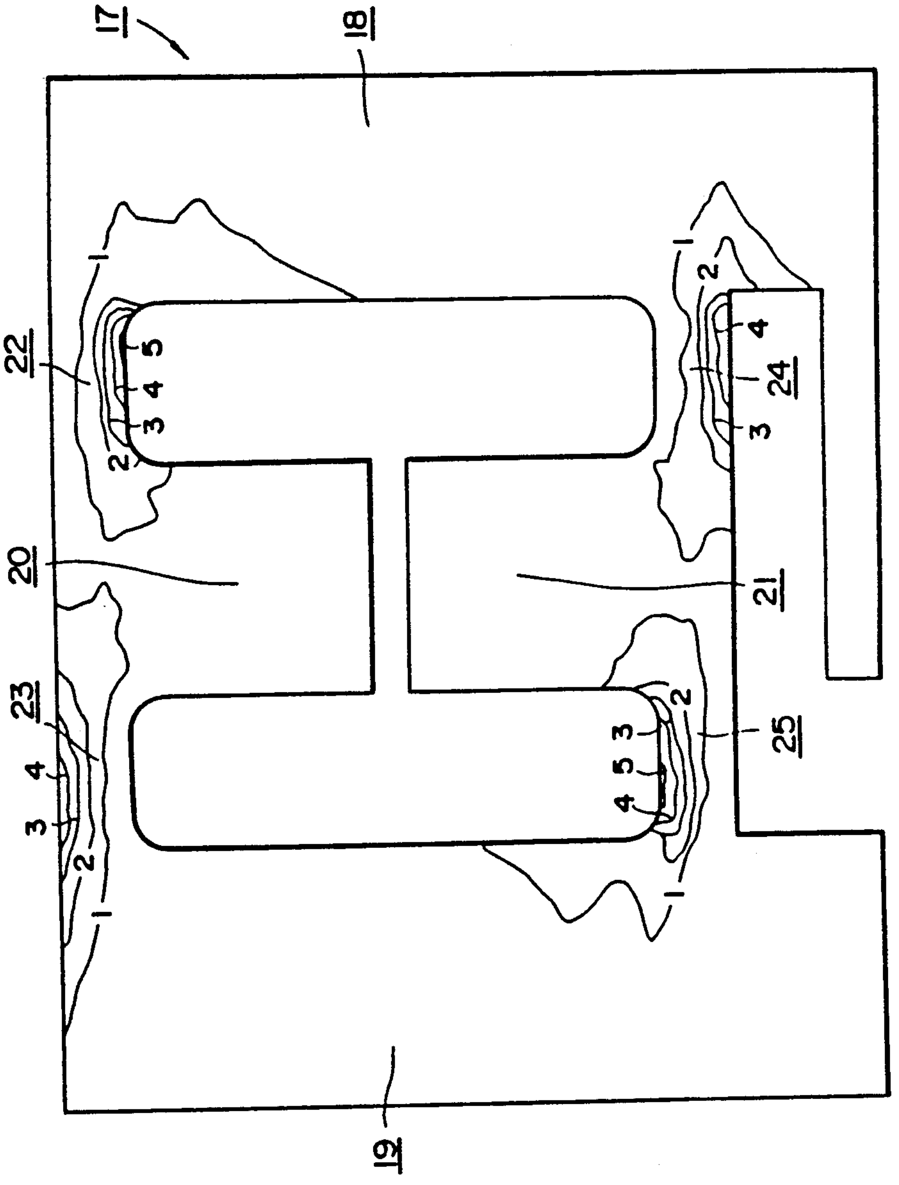
FIG. 6 is a stress distribution diagram of the conventional parallel four-link mechanism.
Figure 13:
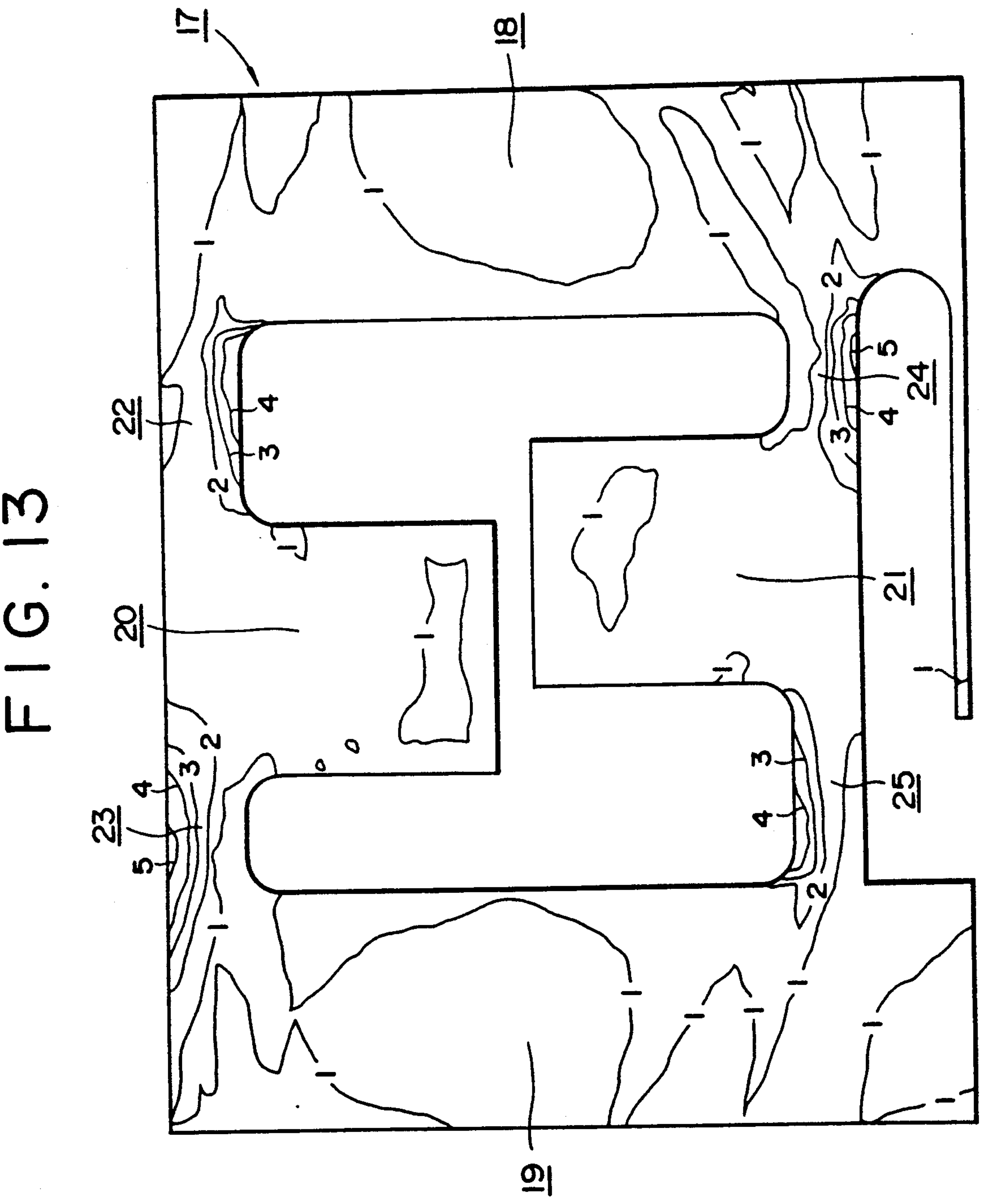
FIG. 13 is a stress distribution diagram of the parallel four-link mechanism according to the present invention.

As the result of analysis using finite element method, a stress distribution shown in FIG. 13 was obtained. In the drawing, the stress becomes strong as the numeral increases. Namely, the equi-stress curve 5 represents the strongest stress. When FIG. 13 is compared with FIG. 6 showing a stress distribution of the conventional parallel four-link mechanism, it is obvious that the stress applied to the disposed inner surfaces of the pair of hinge sections 22 and 25 diagonally disposed is reduced. In FIG. 13, the stress applied to the opposed outer surfaces of the hinge sections 23 and 24 is larger than that of the conventional one. However, the links are not broken unless the stress exceeds the tension limit since the outer surfaces of the hinge sections 23 and 24 are straight and the rounding treatment can be neatly performed.

In addition, when the hinge sections are structured so that the relationship $11 > 12$ is satisfied, the round treatment of the inner surfaces of the hinge sections 22 and 25 can be easily conducted with almost no burring.

Thus, the reduction of fatigue of the hinge sections 22 and 25 and improvement of the rounding treatment allow the opposed inner surfaces of the hinge sections to be free from a crack and thereby a link breakage.

Figure 15:
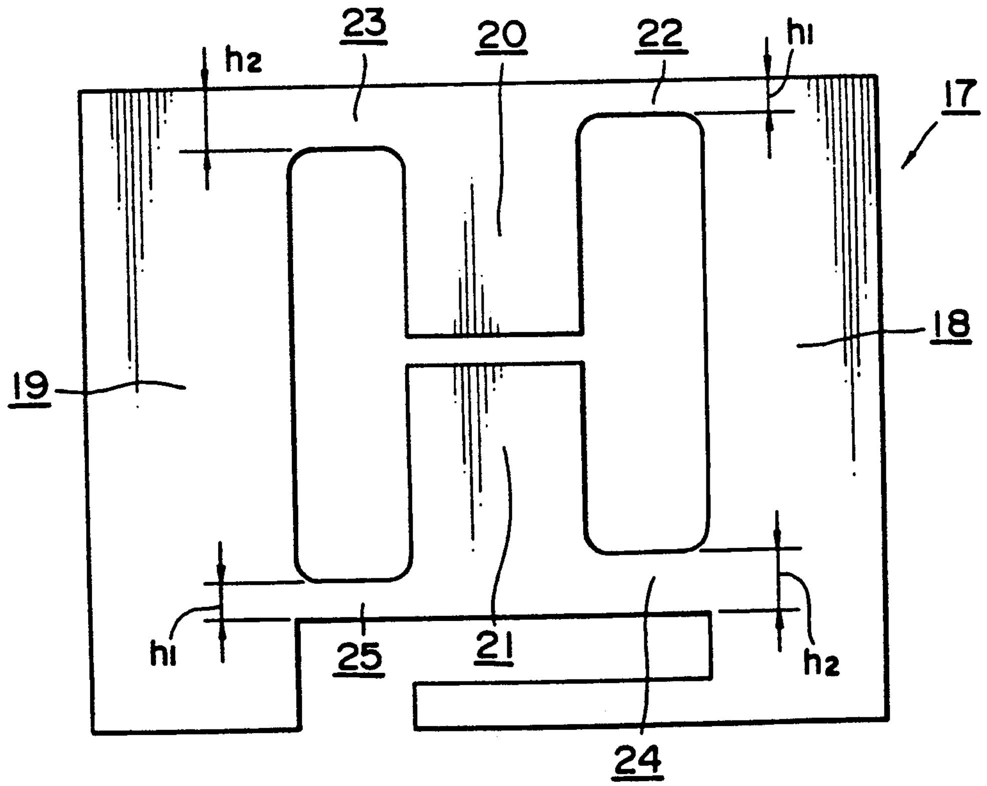
FIG. 15 is a plane view showing another embodiment of the parallel four-link mechanism according to the present invention.

Further, referring to the drawing of FIG. 15, the other embodiment according to the present invention will be described hereinafter.

Figure 1:
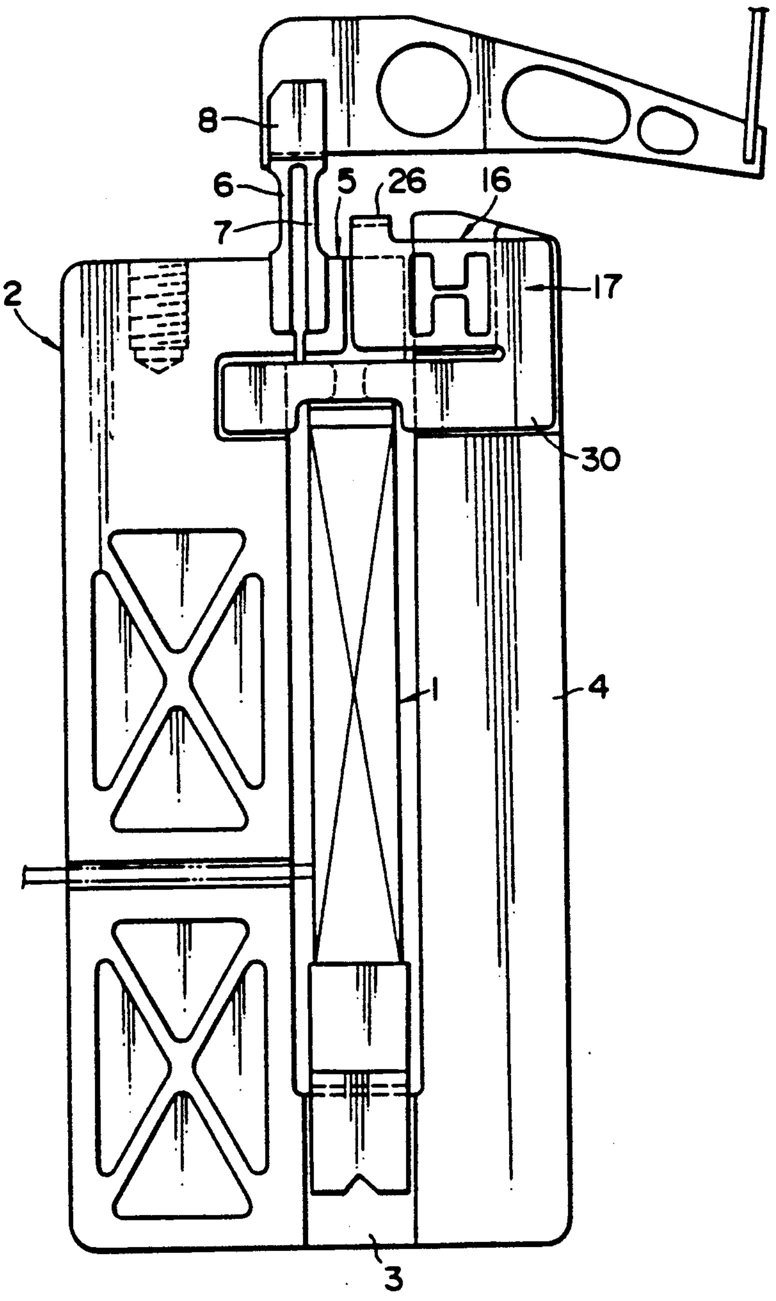
FIG. 1 is a top view of a motion conversion mechanism using a conventional parallel four-link mechanism.
Figure 2:
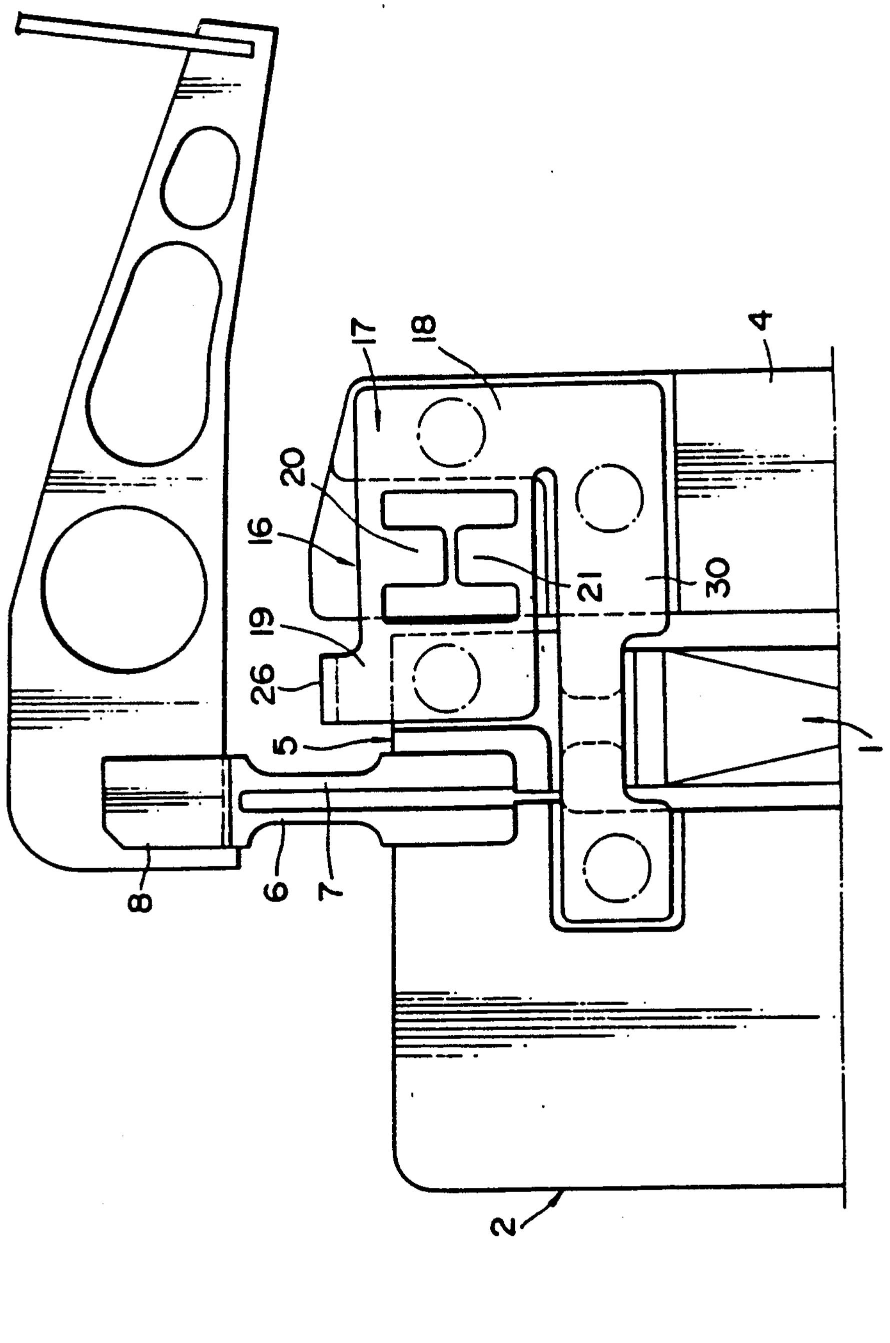
FIG. 2 is an enlarged view of the principal sections of the motion conversion mechanism of FIG. 1.
Figure 3:
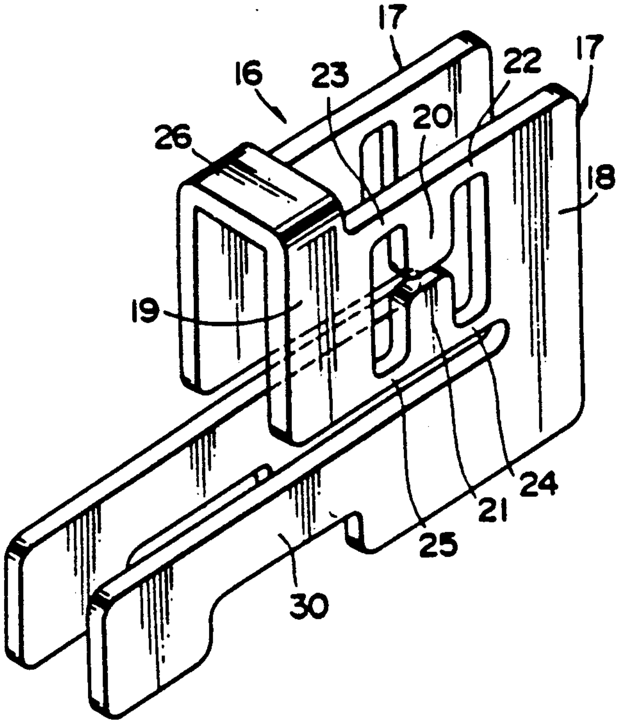
FIG. 3 is a perspective view of the conventional parallel four-link mechanism.
Figure 5:
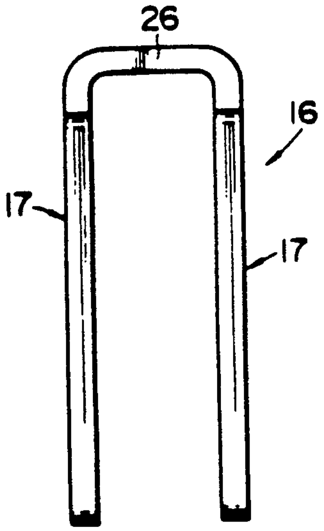
FIG. 5 is a side view of the conventional parallel four-link mechanism of FIG. 3.
Figure 4:
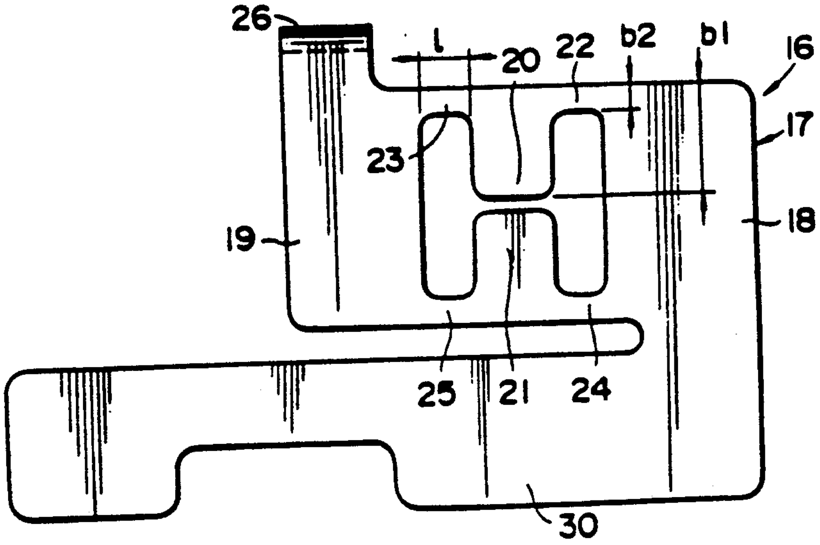
FIG. 4 is a top view of the conventional parallel four-link mechanism of FIG. 3.

As defined by the above equation (1), when the height "h" of the hinge section becomes small, the stress "σ" becomes small. Accordingly, it may be considered that the height "h1" of the pair of hinge sections 22, 25 becomes smaller than the height "h2" of another pair of hinge sections 23, 24. In other words, the relationship $h1 < h2$ is satisfied. In this embodiment, "h1", "h2" and "b2" illustrated in FIG. 4 satisfy the relationship $h1 < b2 < h2$.

Accordingly, the following equations are satisfied, $$\sigma 1 = A\frac{Eh1\delta}{1}\left(\frac{1}{1}-\frac{1}{2}\right)$$

$$\sigma 2 = A\frac{Eh2\delta}{1}\left(\frac{1}{1}-\frac{1}{2}\right)$$

Therefore, $\sigma 1 < \sigma 2$ is satisfied because "E", "1" and δ can be considered as constant.

In addition, by using the motion conversion mechanism employing the present embodiment, since the tension forces σ1 and σ2 applied to the hinge sections of the parallel four-link mechanism 16 satisfy the relationship of $\sigma 1 < \sigma 2$, the rigidity against the bending of each of links 18 to 21 is improved. Thus, the parallel motion of the moving member 5 can be easily conducted. Consequently, the breakage of the leaf springs 6 and 7 and the piezo electric element 1 can be prevented. In addition, since the connecting section 26 of the parallel four-link mechanism 16 is disposed at the base section of the connecting plate section 30, the connecting section 26 can be engaged with the frame by one way operation from the side of the sub frame 4. Moreover, since the length between the connecting section 26 and the adjacent spot-welded portion indicated by numeral 42 in FIG. 8 can be increased, it is possible to prevent the welding strength from degrading due to flowing of welding heat to the connecting section 26 and to prevent an imperfect welding due to incorrect bending of the connecting section 26 and the deformation of the apparatus itself due to pressing of the welding electrode. From the above reasons, by using the parallel four-link mechanism 16 according to the present invention, a highly stable motion conversion mechanism can be accomplished.

What is claimed is:

1. A parallel four-link mechanism integrally formed by a predetermined elastic material, adapted to be positioned in a motion conversion mechanism for converting mechanical expansion and compression of a predetermined material in a predetermined direction to a motion in the desired direction, for regulating the mechanical expansion and compression so as not to be skewed from said predetermined direction by means of the elastic deformation therof in accordance with the mechanical expansion and compression, comprising a pair of plate portions oppositely located which respectively include one pair of links arranged in parallel with each other, another pair of links arranged in parallel with each other, and hinge sections provided between said links adjacently located for respectively connecting said links, said parallel four-link mechanism is arranged in such a manner that the stress generated on the opposed inner surfaces of one pair of hinge sections which are diagonally disposed becomes smaller than that generated on the outer surfaces of another pair of hinge sections which are diagonally disposed when said parallel four-link mechanism is deformed in accordance with the mechanical expansion and compression of said predetermined material.

2. The parallel four-link mechanism according to claim 1, wherein length of said one pair of hinge sections are larger than that of said another pair of hinge sections, a direction of said length being in orthogonal with said predetermined direction when said parallel four-link mechanism is not deformed.

3. The parallel four-link mechanism according to claim 1, wherein height of said one pair of hinge sections are smaller than that of said another pair of hinge sections, a direction of said height being in parallel with said predetermined direction when said parallel four-link mechanism is not deformed.

4. A parallel four-link mechanism integrally formed by a predetermined elastic material including a pair of plate portions oppositely provided with each other, comprising:

link mechanisms, respectively provided on each of said pair of plate portions, including a pair of links provided in parallel with each other;

another link mechanisms, respectively provided on each of said pair of plate portions, including a pair of links provided in parallel with each other;

pairs of hinge sections, respectively provided on each of said pair of plate portions, having a predetermined length, diagonally disposed and provided between one link of said link mechanism and that of said another link mechanism adjacently located with each other; and another pair of hinge sections, respectively provided on each of said pair of plate portions, having another predetermined length larger than said predetermined length, diagonally disposed and provided between another link of said link mechanism and that of said another link mechanism adjacently located with each other.

5. A parallel four-link mechanism integrally formed by a predetermined elastic material including a pair of plate portions oppositely provided with each other, comprising:

link mechanisms, respectively provided on each of said pair of plate portions, including a pair of links provided in parallel with each other;

another link mechanism, respectively provided on each of said pair of plate portions, including a pair of links provided in parallel with each other;

pairs of hinge sections, respectively provided on each of said pair of plate portions, having a predetermined height, diagonally disposed and provided between one link of said link mechanism and that of said another link mechanism adjacently located with each other; and another pair of hinge sections, respectively provided on each of said pair of plate portions, having another predetermined height smaller than said predetermined height, diagonally disposed and provided between another link of said link mechanism and that of said another link mechanism adjacently located with each other.

6. A motion conversion mechanism for converting mechanical expansion and compression of a piezo electric element mounted on a frame member along a predetermined direction to a motion of a predetermined material, said motion conversion mechanism comprising:

moving member connected to one end of said piezo electric element and arranged to be movable in accordance with the expansion and compression of said piezo electric element;

a pair of leaf spring members connected to said moving member for transmitting the movement of said moving member to said predetermined material along said predetermined direction; and a parallel four-link mechanism, including an opposite pair of plate portions between which said moving member is located, integrally formed by a predetermined elastic material and arranged in such a manner that said plate portions respectively include a pair of parallel links and another pair of parallel links, and hinge sections provided between said links adjacently located, said parallel four-link mechanism being arranged in such a manner that the stress generated on the opposed inner surfaces of one pair of hinge sections which are diagonally disposed becomes smaller than that generated on the outer surfaces of another pair of hinge sections which are diagonally disposed when said parallel four-link mechanism is deformed in accordance with the mechanical expansion and compression of said piezo electric element, whereby the movement of said moving member is regulated so as not to be skewed from said predetermined direction by means of the elastic deformation of said parallel four-link mechanism in accordance with the expansion and compression of said piezo electric element without concentration of said stress at said one pair of hinge sections.

7. The motion conversion mechanism according to claim 6, wherein longitudinal length of said one pair of hinge sections are larger than that of said another pair of hinge sections, a direction of said length being in orthogonal with said predetermined direction when said parallel four-link mechanism is not deformed.

8. The motion conversion mechanism according to claim 6, wherein height of said one pair of hinge sections are smaller than that of said another pair of hinge sections, a direction of said height being in parallel with said predetermined direction when said parallel four-link mechanism is not deformed. p

* * * * *